United States Patent

Sakaguchi et al.

Patent Number: 5,260,130
Date of Patent: Nov. 9, 1993

[54] ADHESIVE COMPOSITION AND COVERLAY FILM THEREWITH

[75] Inventors: Mitoshi Sakaguchi; Hiroyuki Iwata; Makoto Fujiwara; Yoshitsugu Eguchi, all of Ibaraki, Japan

[73] Assignee: Shin-Etsu Chemical Co., Ltd., Tokyo, Japan

[21] Appl. No.: 859,276

[22] Filed: Mar. 26, 1992

Related U.S. Application Data

[63] Continuation of Ser. No. 588,447, Sep. 26, 1990, abandoned.

[30] Foreign Application Priority Data

Sep. 29, 1989 [JP] Japan .................. 1-254383
May 18, 1990 [JP] Japan .................. 2-128434

[51] Int. Cl.$^5$ .............. B32B 7/12; C08L 63/10; C08L 63/02
[52] U.S. Cl. ................... 428/355; 428/356; 428/473.5; 428/483; 428/901; 525/113
[58] Field of Search ............ 525/113; 428/355, 473.5, 428/483, 901, 356

[56] References Cited

U.S. PATENT DOCUMENTS

| | | | |
|---|---|---|---|
| 3,932,689 | 1/1976 | Watanabe et al. | 428/460 X |
| 4,465,542 | 8/1984 | Furihata | 428/418 X |
| 4,482,660 | 11/1984 | Minamisawa et al. | 525/113 X |
| 4,500,660 | 2/1985 | Minamisawa et al. | 525/113 X |
| 4,578,315 | 3/1986 | Santorelli | 428/418 X |
| 4,626,474 | 12/1986 | Kim | 428/416 |
| 4,786,675 | 11/1988 | Iwata et al. | 525/113 X |
| 4,897,301 | 1/1990 | Uno et al. | 428/340 X |
| 5,075,378 | 12/1991 | Smierciak et al. | 525/113 X |
| 5,140,068 | 8/1992 | Siebert et al. | 525/113 X |
| 5,140,069 | 8/1992 | Mülhaupt et al. | 525/113 X |
| 5,162,439 | 11/1992 | Tsuji | 525/113 |

Primary Examiner—Daniel Zirker
Attorney, Agent, or Firm—McAulay Fisher Nissen Goldberg & Kiel

[57] ABSTRACT

A coverlay film, which is used for protection of a flexible printed circuit board, is provided by the invention as being imparted with improved adhesiveness, heat-resistance against molten solder alloy, punching workability and other properties. The inventive coverlay film is characterized by the novel and unique formulation of the adhesive to form an adhesive layer on one surface of a substrate plastic, e.g., polyimide, film. The adhesive is formulated with an epoxy resin, carboxylated nitrile rubber, curing agent for the epoxy resin, curing accelerator and fine inorganic powder each of a specified type and in a specified weight proportion.

3 Claims, No Drawings

ADHESIVE COMPOSITION AND COVERLAY FILM THEREWITH

This is a continuation of application Ser. No. 07/588,447, filed Sep. 26, 1990, now abandoned.

BACKGROUND OF THE INVENTION

The present invention relates to a novel adhesive composition and a coverlay film prepared therewith for protecting a flexible printed circuit board having excellent adhesiveness and heat resistance to withstand soldering. A coverlay film consists of a heat resistant plastic film or sheet as a substrate and a layer of an adhesive in a semi-cured or solvent-free state on one surface of the substrate.

Along with the trend in recent years in the electronic instruments toward further and further decreased weight, thickness and size still with more and more increased and upgraded performance, the demand for flexible printed circuit boards is rapidly growing with expansion of the application fields in which they are used. The growing use of flexible printed circuit boards is necessarily accompanied by more and more frequent use of coverlay films for protection of flexible printed circuit boards and performance thereof is eagerly desired to be improved to comply with any high-grade applications. Particular problems of recent frequent issues relative to the coverlay films include the adhesiveness to flexible printed circuit boards, high heat resistance to withstand soldering, electric insulation with low moisture absorption, flexibility, weatherability under adverse ambient conditions and the like. Namely, it is desired that a coverlay film should be imparted simultaneously with improved characteristics in all of these properties.

As is mentioned above, a coverlay film is a laminate consisting of a heat resistant plastic film or sheet and a layer of an adhesive in a semi-cured or solvent-free state usually covered with a sheet of surface-release paper or plastic film for temporary protection from inadvertent sticking. Various kinds of adhesives are conventionally used in the prior art for the purpose including blends of NBR and a phenolic resin, NBR and an epoxy-containing phenolic resin, NBR and an epoxy resin, an epoxy resin and a polyester resin and an epoxy resin and acrylic resin as well as acrylic resins as such. These conventional adhesives have their own advantages and disadvantages and none of them can satisfy all of the requirements simultaneously. For example, the adhesives compounded with an NBR are generally poor in the thermal stability and their thermal degradation is accelerated by compounding with an inorganic flame retardant. Epoxy resin-based adhesives in general exhibit relatively low peeling resistance while brominated epoxy resin-based ones as well as polyester-based and acrylic adhesives are poor in the heat resistance. Furthermore, the coverlay films prepared by using the above described conventional adhesives are disadvantageous in respect of the low workability because the layer of the adhesive can be cured at a high temperature of 170° to 180° C. taking as long as 30 to 60 minutes after the coverlay film freed from the sheet of release paper is applied to the surface of a flexible circuit board.

SUMMARY OF THE INVENTION

The present invention accordingly has an object to provide a novel and improved adhesive composition and a coverlay film for protection of a flexible circuit board having improved performance in respect of the adhesiveness, heat resistance against soldering, especially, even in a moistened state, punching workability and curability by overcoming the above described disadvantages in the prior art coverlay films.

Thus, the adhesive composition of the invention is a uniform blend which comprises:
(a) 100 parts by weight of an epoxy resin;
(b) from 40 to 150 parts by weight of a nitrile rubber containing carboxyl groups;
(c) from 1 to 50 parts by weight of a curing agent;
(d) from 0.1 to 5 parts by weight of a curing accelerator selected from the group consisting of imidazole compounds, tertiary amine tetraphenyl borates, zinc borofluoride, tin borofluoride and nickel borofluoride; and
(e) from 5 to 70 parts by weight of a finely divided inorganic powder selected from the group consisting of metal hydroxides, inorganic oxides, metal carbonates, metal silicates and boron nitride.

The coverlay film of the present invention for the protection of a flexible circuit board accordingly comprises:
(A) a heat-resistant plastic film as a substrate; and
(B) a layer of an adhesive composition in a semi-cured or solvent-free state on one surface of the heat-resistant plastic film, the adhesive composition comprising, as a blend:
(a) 100 parts by weight of an epoxy resin;
(b) from 40 to 150 parts by weight of a nitrile rubber containing carboxyl groups;
(c) from 1 to 50 parts by weight of a curing agent;
(d) from 0.1 to 5 parts by weight of a curing accelerator selected from the group consisting of imidazole compounds, tertiary amine tetraphenyl borates, zinc borofluoride, tin borofluoride and nickel borofluoride; and
(e) from 5 to 70 parts by weight of a finely divided inorganic powder selected from the group consisting of metal hydroxides, inorganic oxides, metal carbonates, metal silicates and boron nitride.

DETAILED DESCRIPTION OF THE PREFERRED EMBODIMENTS

As the heat-resistant plastic film as the substrate in the inventive coverlay film which is coated on one surface with the inventive adhesive composition, films of various plastics can be used without particular limitations including polyimides, polyphenylene sulfides, poly(parabanic acids), heat-resistant polyesters, poly(ether sulfones), polyether ether ketones) and the like, of which polyimides are preferred. The films should have a thickness in the range from 0.010 to 0.20 mm or, preferably, from 0.013 to 0.125 mm. The plastic films should have heat resistance not to cause substantial degradation by heating in the course of the soldering works using molten solder alloys at a temperature of 200° C. or higher.

The most characteristic feature of the inventive coverlay film consists in the unique formulation of the adhesive composition for forming a layer on one surface of the above mentioned heat-resistant plastic film. The adhesive composition is formulated with five kinds of essential ingredients, of which the epoxy resins as the component (a) can be any one of known epoxy resins having at least two epoxy groups per molecule without particular limitations including the glycidyl ether type ones such as bisphenol A type epoxy resins, novolac resins and the like, alicyclic epoxy resins, aromatic epoxy resins, halogenated epoxy resins and the like. These epoxy resins can be used either singly or as a combination of two kinds or more according to need. Among the above named various types of epoxy resins, halogenated epoxy resins are preferable and, in particular, brominated epoxy resins are more preferable in respect of the excellent flame retardancy of the adhesive composition compounded therewith.

The above mentioned brominated epoxy resin is not particularly limitative provided that the molecule contains epoxy groups and bromine atoms including bisphenol-type and novolactype ones. Several commercial products of brominated epoxy resins are available including Epikotes 5045 containing 19% by weight of bromine, 5046 containing 21% by weight of bromine, 5048 containing 25% by weight of bromine, 5049 containing 26% by weight of bromine and 5050 containing 49% by weight of bromine (each a product by Yuka Shell Epoxy Co.) and BREN-S containing 35% by weight of bromine (a product by Nippon Kayaku Co.). These brominated epoxy resins can be used either singly or as a combination of two kinds or more according to need. Preferably, the bromine content of the brominated epoxy resin should be in the range from 21 to 51% by weight.

The nitrile rubber having carboxyl groups as the component (b) is a copolymeric rubber of acrylonitrile and butadiene carboxylated at the molecular chain ends. Commercial products of nitrile rubber suitable for the purpose include Hycars CTBN and CTBNX each produced by Goodrich Co., Nipols 1072J, 1072B, DN 612, DN 631 and DN 601 each produced by Nippon Zeon Co. and the like. These carboxyl-containing nitrile rubbers can be used either singly or as a combination of two kinds or more according to need. Preferably, the carboxyl-containing nitrile rubber should contain from 2 to 8% by weight of the carboxyl groups.

The amount of the carboxyl-containing nitrile rubber as the component (b) in the adhesive composition is in the range from 40 to 150 parts by weight or, preferably, from 40 to 100 parts by weight per 100 parts by weight of the epoxy resin as the component (a). When the amount thereof is too small, the adhesive layer would have an unduly low peeling resistance while, when the amount thereof is too large, the adhesive would be thermally unstable to cause degradation at high temperatures.

The curing agent as the component (c) is a curing agent for the epoxy resin as the component (a). Various kinds of known epoxy-curing agents can be used without particular limitations including amine compounds such as diethylene triamine, triethylene tetramine, m-xylylene diamine, 4,4'-diaminodiphenyl methane, 4,4'-diaminodiphenyl sulfone and the like, acid anhydrides such as phthalic anhydride, hexahydrophthalic anhydride, tetrahydrophthalic anhydride, trimellitic anhydride and the like, dicyandiamide, boron trifluoride-amine complex compounds and the like. These epoxy-curing agents can be used either singly or as a combination of two kinds or more according to need.

The amount of the above named epoxy-curing agent as the component (c) in the adhesive composition is in the range from 1 to 50 parts by weight or, preferably, from 3 to 30 parts by weight per 100 parts by weight of the epoxy resin as the component (a) although the exact amount thereof should be selected depending on the types of the epoxy resin and the curing agent. When the amount thereof is too small, the adhesive cannot be fully cured by heating so that the heat resistance of the coverlay film would be decreased. When the amount thereof is too large, on the other hand, the curing reaction of the adhesive may proceed even at room temperature so that the storability of the coverlay film with an adhesive layer would be decreased in addition to the disadvantages of the decreased heat resistance against soldering, decrease in the peeling resistance and decrease in the flowability of the adhesive composition.

The curing accelerator as the component (d) in the adhesive composition serves to promote the curing reaction of the epoxy resin with the curing agent. Various compounds can be used for the purpose including imidazole compounds such as 2-alkyl-4-methyl imidazoles, 2-alkyl-4-ethyl imidazoles, 1-(2-cyanoethyl)-2-alkyl imidazoles, 2-phenyl imidazole and the like, tertiary amine tetraphenyl borates, such as triethyl ammonium tetraphenyl borate of the formula [$(C_2H_5)_3NH$][$B(C_6H_5)_4$] and the like, zinc borofluoride, tin borofluoride, nickel borofluoride and the like. These compounds can be used either singly or as a combination of two kinds or more according to need. Among the above compounds, tertiary amine tetraphenyl borates and the borofluorides of zinc, tin or nickel are preferable and the borofluorides of zinc, tin and nickel are more preferable.

The amount of the curing accelerator as the component (d) in the adhesive composition is in the range from 0.1 to 5 parts by weight or, preferably, from 0.2 to 3 parts by weight per 100 parts by weight of the epoxy resin as the component (a). When the amount thereof is too small, curing of the adhesive takes an unduly long time and the workability of the coverlay film is poor with too high flowability of the adhesive and poor heat resistance against soldering. When the amount thereof is too large, on the other hand, the coverlay film would have decreased storability due to curing of the adhesive composition even at room temperature along with a decrease in the workability due to the poor flowability of the adhesive.

The finely divided inorganic powder as the component (e) in the adhesive composition serves to impart the coverlay film having the adhesive layer with good punching workability along with improved heat resistance imparted to the adhesive. Suitable inorganic powders include metal hydroxides such as aluminum hydroxide, magnesium hydroxide and the like, inorganic oxides such as zinc oxide, magnesium oxide, antimony trioxide, silicon dioxide and the like, metal carbonates such as calcium carbonate, magnesium carbonate and the like, metal silicates such as aluminum silicate, magnesium silicate, calcium silicate and the like, boron nitride and so on. These inorganic powders can be used either singly or as a combination of two kinds or more according to need. The particles of the inorganic powder should have a particle diameter not exceeding 10 $\mu$m or, preferably, not exceeding 5 $\mu$m in order to comply with the recent trend in the flexible printed circuit boards toward finer and finer patterning of the circuit down to a few tens of micrometers of fineness or even finer.

It is sometimes advantageous that the finely divided inorganic powder as the component (e) is subjected to a hydrophobilizing treatment prior to compounding with the other ingredients with an object to improve the compatibility of the particles with the resinous matrix and to decrease the moisture absorptivity. Examples of the agents used in the hydrophobilizing treatment of the particle surface include silicone fluids, organochlorosilanes such as dimethyl dichlorosilane and the like, silane coupling agents such as alkyl triethoxy silanes, methyl triethoxy silane and the like, and so on.

The amount of the finely divided inorganic powder as the component (e) in the adhesive composition should be in the range from 5 to 70 parts by weight or, preferably, from 10 to 50 parts by weight per 100 parts by weight of the epoxy resin as the component (a). When the amount thereof is too small, the coverlay film would have poor heat resistance and punching workability. When the amount thereof is too large, on the other hand, the peeling resistance of the adhesive layer from a flexible printed circuit board would be decreased.

The adhesive composition to be applied to the surface of the heat-resistant plastic film as the substrate can be prepared by uniformly blending the above described components (a) to (e) with other optional ingredients conventionally used in adhesive compositions including organic solvents, exemplified by methyl ethyl ketone, dioxane, dimethyl formamide, toluene, tetrahydrofuran and the like, to control the applicability of the composition in coating. The thus prepared adhesive composition is applied to the surface of the heat-resistant plastic film by using a suitable coating machine. The amount of coating should preferably be such that the adhesive layer after drying of the solvent may have a thickness in the range from 10 to 60 $\mu$m. The adhesive layer is then brought into a solvent-free state, if necessary, by heating, for example, at a temperature of 80° to 150° C. for 1 to 30 minutes.

The coverlay film consisting of a heat-resistant plastic film and an adhesive layer formed thereon is usually overlaid with a sheet of release paper or film on the surface of the adhesive layer for temporary protection by using a roller laminator and the like and wound up in a roll to facilitate handling and transportation. Examples of suitable release paper or film include films of polyethylene, polypropylene, TPX resin and the like, polyester films laminated with a silicone-based surface release agent, sheets of paper coated with a film of a polyolefin, e.g., polyethylene and polypropylene, polyvinylidene chloride and the like, and so on though not particularly limitative thereto.

In the following, examples and comparative examples are given to illustrate the inventive coverlay films in more detail but not to limit the scope of the invention in any way. In the following description, the terms of "parts" and "%" always refer to "parts by weight" and "% by weight", respectively, relative to the solid matter.

EXAMPLES AND COMPARATIVE EXAMPLES

In each of the 22 experiments, of which Experiments No. 1 to No. 12 were for the invention and No. 13 to No. 22 were for comparative purpose, the ingredients shown in Table 1 each taken in an amount shown in the table in parts were uniformly dissolved or dispersed in methyl ethyl ketone by using a ball mill to give an adhesive composition containing 30% of the solid matter. The ingredients indicated in the table with abridgements are characterized as follows.

Epoxy resins

A: Epikote 828, bisphenol A-type, epoxy equivalent 190 g/equivalent, a product by Yuka Shell Epoxy Co.
B: Epikote 1001, bisphenol A-type, epoxy equivalent 475 g/equivalent, a product by Yuka Shell Epoxy Co.
C: Epikote 5045, brominated epoxy resin, epoxy equivalent 475 g/equivalent, bromine content 19%, a product by Yuka Shell Epoxy Co.
D: Epikote 5048, brominated epoxy resin, epoxy equivalent 673 g/equivalent, bromine content 25%, a product by Yuka Shell Epoxy Co.
E: Epikote 5050, brominated epoxy resin, epoxy equivalent 390 g/equivalent, bromine content 49%, a product by Yuka Shell Epoxy Co.

Carboxylated nitrile rubbers

A: Nipol 1072J, a product by Nippon Zeon Co. containing sodium ions and 6 to 7% of carboxyl groups
B: Nipol 1072, a product by Nippon Zeon Co. containing calcium ions and 6 to 7% of carboxyl groups Curing agent 4,4'-Diaminodiphenylsulfone Curing accelerators A: 1-(2-Cyanoethyl)-2-ethyl-4-methyl imidazole
B: Triethyl ammonium tetraphenyl borate
C: Zinc borofluoride
D: Tin borofluoride Inorganic powders A: Antimony trioxide, having an average particle diameter of 0.02 $\mu$m
B: Silica, having an average particle diameter of 0.02 $\mu$m
C: Aluminum hydroxide, having an average particle diameter of 1 $\mu$m
D: Zinc oxide, having an average particle diameter of 0.3 $\mu$m A film of polyimide resin (Kapton 100H, a product by Du Pont Co.) having a thickness of 25 $\mu$m was coated on one surface with the above prepared adhesive composition in such a coating amount that the adhesive layer after evaporation of the solvent had a thickness of 30 $\mu$m and then heated in an oven first at 80° C. for 2 minutes and then at 120° C. for 5 minutes so as to completely evaporate the solvent and bring the adhesive composition into the so-called B-stage. The thus adhesive-coated surface of the polyimide film was overlaid with a sheet of silicone-coated release paper and laminated therewith by press-bonding in a roller laminator at 50° C. under a linear pressure of 5 kg/cm at a line velocity of 2 meters/minute to prepare a release paper-overlaid coverlay film.

The coverlay film freed from the release paper was laminated on the adhesive layer with a 35 $\mu$m thick electrolytic copper foil on the glossy surface by pressing at 160° C. for 10 minutes under a pressure of 50 kg/cm$^2$ to prepare a laminate which was subjected to the evaluation tests to give the results shown in Table 2 according to the testing procedures given below.

1. Peeling resistance

According to the procedure specified in JIS C 6481, the specimen cut in a width of 10 mm was subjected to peeling of the copper foil at room temperature in a 90° direction at a pulling velocity of 50 mm/minute.

2. Heat resistance against molten solder alloy

A piece of the specimen was laid on the surface of a bath of molten solder alloy with the copper foil facing down at varied temperatures for 30 seconds and the highest temperature, at which no blistering or other defects could be detected in the specimen, was recorded. The sample specimens were tested either after seasoning for 24 hours in an atmosphere of 60% relative humidity at 20° C. or after moistening treatment by keeping for 1 hour in an atmosphere of 90% relative humidity at 40° C.

3. Flame retardancy

The flame retardancy of the sample specimens was tested according to the procedure specified in UL-94 Standard and graded in four ratings of V-0, V-1, V-2 and HB, V-0 being for the best or highest flame retardancy.

4. Punching workability

Two coverlay films of 24 cm by 30 cm dimensions with the release paper were laid one on the other each with the release paper facing down and punched on a die to make 500 circular holes of 3 mm diameter and the condition of the peripheries of the thus formed 1000 holes was visually examined. The results of this visual test were quite satisfactory to give completely punched holes of good-conditioned peripheries in all of the experiments excepting Experiments No. 17 and No. 20 for comparative purpose, in which more than 5% of the holes were incompletely punched.

5. Press-out of adhesive

A coverlay film freed from the release paper and provided with a hole of 3 mm diameter by punching was press-bonded with a copper foil at 160° C. for 10 minutes under a pressure of 50 kg/cm$^2$ with the adhesive layer contacting the glossy surface of a copper foil and the distance of the adhesive layer oozing out of the periphery into the hole was determined by using a cathetometer.

As to the results obtained in the above described testing procedures, it is generally accepted that a coverlay film suitable for practical use should give the testing results including 50 to 200 μm of the adhesive press-out, at least 1.0 kg/cm of the peeling resistance and at least 300° C. and at least 250° C. of the heat resistance against molten solder alloy as seasoned under normal conditions and moistened under high-humidity and high-temperature conditions, respectively.

TABLE 1

| | Experiment No. | | | | | | | |
|---|---|---|---|---|---|---|---|---|
| | 1 | 2 | 3 | 4 | 5 | 6 | 7 | 8 |
| Epoxy resin (parts) | A (40) B (60) | A (40) B (60) | A (40) B (60) | A (40) B (60) | A (40) B (60) | A (40) B (60) | C (100) | C (30) E (70) |
| Carboxylated nitrile rubber (parts) | A (80) | A (100) | B (80) | A (100) | B (100) | B (80) | A (100) | A (100) |
| Curing agent, parts | 15 | 15 | 15 | 15 | 15 | 15 | 15 | 15 |
| Curing accelerator (parts) | A (1.0) | A (0.5) | B (0.2) | B (0.5) | C (3.0) | D (1.0) | A (0.5) | A (0.5) |
| Inorganic powder (parts) | C (40) | B (10) | B (10) | C (50) D (5) | B (10) | C (40) | A (20) D (5) | B (10) D (5) |

| | Experiment No. | | | | | | |
|---|---|---|---|---|---|---|---|
| | 9 | 10 | 11 | 12 | 13 | 14 | 15 |
| Epoxy resin (parts) | D (10) E (90) | E (100) | D (10) E (90) | D (10) E (90) | A (40) B (60) | A (40) B (60) | A (40) B (60) |
| Carboxylated nitrile rubber (parts) | B (80) | A (100) | B (70) | B (80) | A (100) | A (100) | A (30) |
| Curing agent, parts | 10 | 15 | 15 | 15 | 15 | 15 | 15 |
| Curing accelerator (parts) | B (0.5) | B (0.2) | C (1.3) | D (1.0) | C (6.0) | | B (0.5) |
| Inorganic powder (parts) | C (50) D (2.5) | B (10) | C (50) | C (40) D (2.0) | B (10) | B (10) | C (50) |

| | Experiment No. | | | | | | |
|---|---|---|---|---|---|---|---|
| | 16 | 17 | 18 | 19 | 20 | 21 | 22 |
| Epoxy resin (parts) | A (40) B (60) | A (40) B (60) | D (10) E (90) | D (10) E (90) | C (100) | C (100) | D (10) E (90) |
| Carboxylated nitrile rubber (parts) | A (100) | A (100) | B (70) | B (70) | A (100) | A (30) | B (80) |
| Curing agent, parts | 15 | 15 | 15 | 15 | 15 | 15 | 15 |
| Curing accelerator (parts) | B (0.5) | B (0.5) | C (1.3) | | A (0.5) | A (0.5) | D (7.0) |
| Inorganic powder (parts) | C (90) | | C (80) | C (50) | | A (20) D | C (40) D |

TABLE 1-continued

|  | (5) | (2) |
|---|---|---|

TABLE 2

| | Experiment No. | | | | | | | |
|---|---|---|---|---|---|---|---|---|
| | 1 | 2 | 3 | 4 | 5 | 6 | 7 | 8 |
| Adhesive press-out, μm | 190 | 200 | 170 | 160 | 100 | 120 | 200 | 200 |
| Peeling resistance, kg/cm | 1.5 | 1.7 | 1.4 | 1.6 | 1.7 | 1.4 | 1.7 | 1.6 |
| Heat resistance on molten solder | | | | | | | | |
| normal, °C. | 310 | 310 | 310 | 320 | 320 | 320 | 300 | 300 |
| moistened, °C. | 250 | 250 | 250 | 250 | 250 | 260 | 250 | 250 |
| Flame retardancy | | | | | | | V-0 | V-0 |

| | Experiment No. | | | | | | |
|---|---|---|---|---|---|---|---|
| | 9 | 10 | 11 | 12 | 13 | 14 | 15 |
| Adhesive press-out, μm | 170 | 180 | 140 | 130 | 10 | 1400 | 130 |
| Peeling resistance, kg/cm | 1.5 | 1.6 | 1.5 | 1.4 | 0.8 | 1.1 | 0.5 |
| Heat resistance on molten solder | | | | | | | |
| normal, °C. | 310 | 300 | 310 | 310 | 310 | 240 | 300 |
| moistened, °C. | 250 | 250 | 250 | 250 | 250 | 200 | 250 |
| Flame retardancy | V-0 | V-0 | V-0 | V-0 | | | |

| | Experiment No. | | | | | | |
|---|---|---|---|---|---|---|---|
| | 16 | 17 | 18 | 19 | 20 | 21 | 22 |
| Adhesive press-out, μm | 100 | 200 | 150 | 1300 | 220 | 190 | 0 |
| Peeling resistance, kg/cm | 0.4 | 1.6 | 0.4 | 1.5 | 1.5 | 0.6 | 0.7 |
| Heat resistance on molten solder | | | | | | | |
| normal, °C. | 320 | 280 | 300 | 250 | 280 | 300 | 310 |
| moistened, °C. | 260 | 220 | 250 | 200 | 220 | 250 | 250 |
| Flame retardancy | | | V-0 | V-0 | V-1 | V-0 | V-0 |

What is claimed is:

1. A coverlay film for the protection of a flexible circuit board which comprises:
   (A) a heat-resistant plastic film; and
   (B) a layer of an adhesive composition in a semi-cured or solvent-free state formed on one surface of the heat-resistant plastic film, the adhesive composition comprising, as a blend:
      (a) 100 parts by weight of an epoxy resin;
      (b) from 40 to 150 parts by weight of a nitrile rubber containing carboxyl groups;
      (c) from 1 to 50 parts by weight of a curing agent;
      (d) from 0.1 to 5 parts by weight of a curing accelerator selected from the group consisting of borofluorides of zinc, tin or nickel; and (e) from 5 to 70 parts by weight of a finely divided inorganic powder selected from the group consisting of metal hydroxides, inorganic oxides, metal carbamates, metal silicates and boron nitride.

2. The coverlay film as claimed in claim 1 in which the layer of the adhesive has a thickness in the range from 10 to 60 μm.

3. The coverlay film as claimed in claim 1 in which the heat-resistant plastic film is a polyimide film.

* * * * *